United States Patent [19]
Huang et al.

[11] Patent Number: 6,027,994
[45] Date of Patent: Feb. 22, 2000

[54] METHOD TO FABRICATE A DUAL METAL-DAMASCENE STRUCTURE IN A SUBSTRATE

[75] Inventors: Yimin Huang, Taichung Shien; Tri-Rung Yew, Hsinchu, both of Taiwan

[73] Assignee: United Microelectronics Corp., Hsinchu, Taiwan

[21] Appl. No.: 09/102,083

[22] Filed: Jun. 22, 1998

[51] Int. Cl.[7] .................................................. H01L 21/4763
[52] U.S. Cl. ........................ 438/618; 438/622; 438/624; 438/627; 438/628; 438/629; 438/633; 438/634; 438/637; 438/638; 438/639; 438/643; 438/644; 438/653; 438/654; 438/666; 438/667; 438/668; 438/672
[58] Field of Search ...................... 438/618, 622, 438/624, 627, 628, 629, 633, 634, 637, 638, 639, 643, 644, 653, 654, 666, 667, 668, 672

[56] References Cited

U.S. PATENT DOCUMENTS

| | | | |
|---|---|---|---|
| 5,312,777 | 5/1994 | Cronin et al. ............................ | 437/195 |
| 5,530,262 | 6/1996 | Cronin et al. ............................ | 257/10 |
| 5,539,255 | 7/1996 | Cronin ..................................... | 257/750 |
| 5,614,765 | 3/1997 | Avanzino et al. ....................... | 257/774 |
| 5,654,232 | 8/1997 | Gardner ................................... | 438/661 |
| 5,686,354 | 11/1997 | Avanzino et al. ....................... | 437/190 |
| 5,759,911 | 6/1998 | Cronin et al. ............................ | 438/622 |
| 5,801,094 | 9/1998 | Yew et al. ................................ | 438/624 |

Primary Examiner—Jey Tsai
Assistant Examiner—Lynne A. Gurley

[57] ABSTRACT

A method to fabricate a dual damascene structure in a substrate is disclosed in the present invention. A first silicon oxide layer is deposited over the substrate and a silicon nitride layer is formed on the first silicon oxide layer. The first silicon oxide layer and the silicon nitride layer are etched in order to form a via hole on the substrate. Afterwards, a second silicon oxide layer is deposited to refill into the via hole and to cover the silicon nitride layer. A dry etching process is performed to remove the second silicon oxide layer in the via hole and to form a metal trench in the second silicon oxide layer on the silicon nitride layer and a metal trench in the second silicon oxide layer above the via hole. After the formation of the metal trenches, a portion of the second silicon oxide layer is remained on the sidewalls and the bottom of the via hole. A dry etching process is performed to remove the remaining portion of the second silicon oxide layer. At last, metal material is deposited to refill into the via hole and the metal trench, it is followed by the metal CMP processs to remove the excess metal over the silicon oxide. The dual metal-damascene structure on the substrate is complete.

20 Claims, 4 Drawing Sheets

METHOD TO FABRICATE A DUAL METAL-DAMASCENE STRUCTURE IN A SUBSTRATE

FIELD OF THE INVENTION

The present invention relates to a method to fabricate interconnect lines of integrated circuits, and more specifically, to a method to fabricate a dual metal-damascene structure in a substrate to manufacture interconnection lines of integrated circuits.

BACKGROUND OF THE INVENTION

In ultra large-scale integrated (ULSI) circuit's manufacturing, semiconductor devices are fabricated on a substrate or a silicon wafer. After the formation of the devices, metal lines for interconnection are defined by using a metallic process. As the integration of integrated circuits increases, the manufacturing with high yield and high reliability of metal interconnect lines is hard to achieve. A method to fabricate a metal-damascene structure is to etch trenches for metal interconnect lines and then metal material is refilled into the trenches. The method offers a better way to fabricate the submicron VLSI interconnection with high performance and high reliability, and it becomes be a better structure for metal interconnect of submicron VLSI integrated circuits.

Self-aligned metal-damascene process, where a SiN layer that used as the stopper of a metal-trench etching is sandwiched between two IMD layers, is one of the popular scheme to fabricate the metal-damascene trench structure. In the following description, a conventional method for fabricating a dual damascene structure on a substrate is explained with referring to FIG. 1 to 5.

Referring to FIG. 1, a substrate 100 is provided and a metal interconnect line 10 is fabricated in the substrate 100. An intermetal dielectric (IMD) layer 110 covers the substrate 100 and a silicon nitride layer 120 is formed on the IMD layer 110. As skilled in the art, the IMD layer 110 has a thickness between about 6000 to 10000 angstroms and the silicon nitride layer 120 has a thickness between about 1000 to 2000 angstroms.

Referring to FIG. 2, a lithography and an etching process are performed to form a via pattern. The silicon nitride layer 120 is etched to define an opening in the IMD layer 110 on the metal interconnect line 10. The technology to define the opening on the IMD layer 110 is typically an anisotropically etching process, such as a plasma etching process.

Referring to FIG. 3, an IMD layer 130 is deposited over the silicon nitride layer 120 and it is refilled into the opening. As known in the art, the IMD layer 110 and 130 are typically formed of silicon oxide material, which is deposited by using a conventional chemical vapor deposition (CVD) process.

Referring to FIG. 4, a lithography process and an etching process are performed to form a via hole A, a metal trench C and a metal trench B. The IMD layer 130 and 110 are etched to form the via hole A of the metal interconnect line 10, the metal trench B on the silicon nitride layer 120 and the metal trench C. During the etching of the IMD layer 130 and 110, the silicon nitride layer 120 is used to be an etching stopper to control the depths of the metal trench A and B.

Referring to FIG. 5, a glue/barrier layer 135 is deposited on the sidewalls and the bottom of the via hole A, the trench B and the trench C. Afterwards, a metal layer 140 is refilled into the via hole A, the metal trench B and the metal trench C, and it is deposited on the IMD layer 130. Finally, a chemical mechanical polishing (CMP) process is performed for planarization to remove the metal layer 140 on the IMD layer 130.

However, the major issue concerning the above damascene scheme is the SiN loss. The IMD layer 130 on the silicon nitride layer 120 is etched before the formation of the metal trench C and the silicon nitride layer 120 is simultaneously etched. The silicon nitride layer 120 is used to be an etching stopper of the metal trench B. Thus, a thick SiN layer must be used to control the depth of metal trenches. Nevertheless, because of the thicker silicon nitride layer 120, an additional stress between the thick SiN layer and the IMD layers is induced, and a parasitic capacitance between metal lines is increased.

SUMMARY OF THE INVENTION

A method to fabricate a dual-damascene structure on a substrate, comprising the following steps. A first intermetal dielectric layer is formed on the substrate. A silicon nitride layer is deposited on the first intermetal dielectric layer. The first intermetal dielectric layer and the silicon nitride layer are etched to form a via hole on the substrate. A second intermetal dielectric layer is formed on the silicon nitride and to refill into the via hole. The second intermetal dielectric layer is etched to form a metal trench on the silicon nitride layer and a metal trench in the second intermetal dielectric layer, wherein the second intermetal dielectric layer in the via hole is etched and a portion of the second intermetal dielectric layer is remained on sidewalls and bottom of the via hole. The remaining portion of the second intermetal dielectric layer in the via hole is removed. A barrier layer is formed on the sidewalls and the bottom of the via hole and the metal trenches. A metal layer is deposited on the glue/barrier layer to refill into the via hole and the metal trenches and to cover the second intermetal dielectric layer. At last, a chemical mechanical polishing (CMP) process is implemented to remove the metal layer on the second intermetal dielectric layer.

In the present invention, a method with nonconformal deposition ability is used to form the second intermetal dielectric layer. After the deposition of the second intermetal dielectric layer, a void is formed in the via hole. During the etching of the metal trenches and the via hole, the second intermetal dielectric layer is etched to expose the void and the etching of the second intermetal dielectric layer in the via hole spends a short time. Thus, a thinner silicon nitride layer could be used to control the etching depth of the metal trenches on the silicon nitride, the stress between the IMD layers and the thickness of the silicon nitride layer is reduced and the parasitic capacitance between metal lines is decreased.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method to fabricating a dual damascene structure on a substrate for interconnection lines is described herein. In the present invention, a dual damascene structure is fabricated on a substrate and the loss of a silicon nitride between two intermetal dielectric layers is reduced. A thinner silicon nitride layer serves as an etching stopper, an additional stress between the thinner silicon nitride layer and the intermetal dielectric layer is reduced, and the parasitic capacitance between metal lines is lowered down, too.

Figure 1:
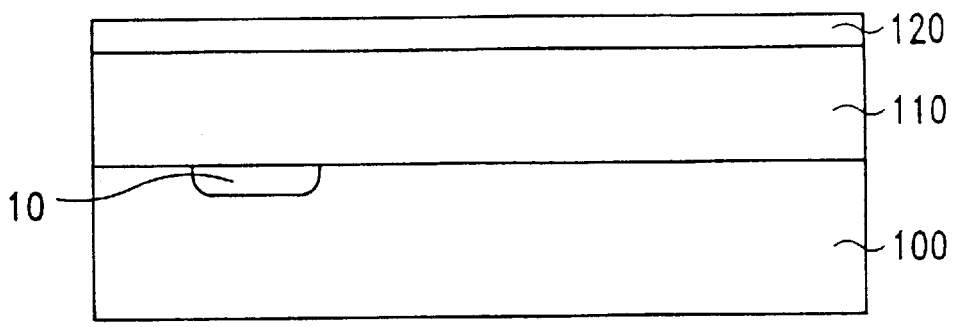
FIGS. 1 is a cross-section's view of a substrate having a metal interconnect line, a oxide/nitride composing layer covers on the substrate in accordance with prior art.
Figure 2:
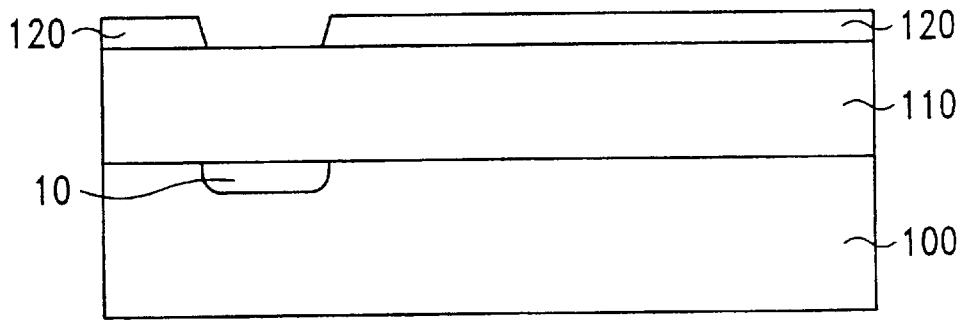
FIG. 2 shows that a silicon nitride layer is etched to form a via hole in accordance with prior art.
Figure 3:
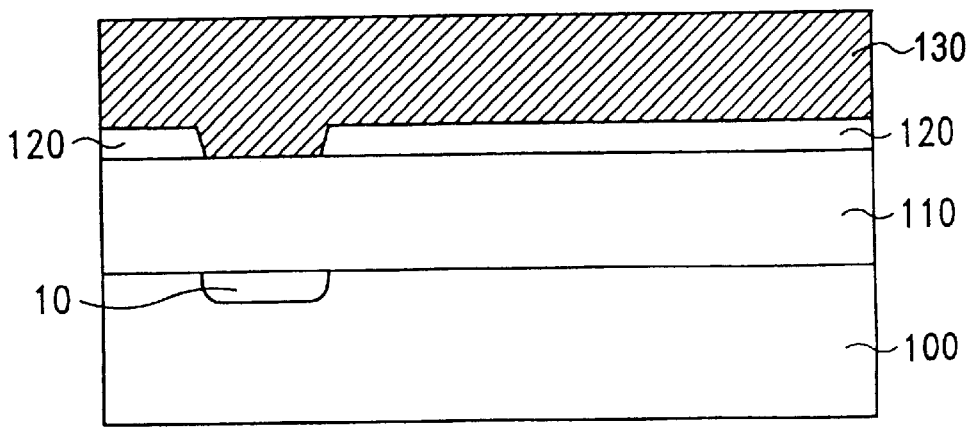
FIG. 3 shows the formation of a silicon oxide on a silicon nitride layer in accordance with prior art.
Figure 4:
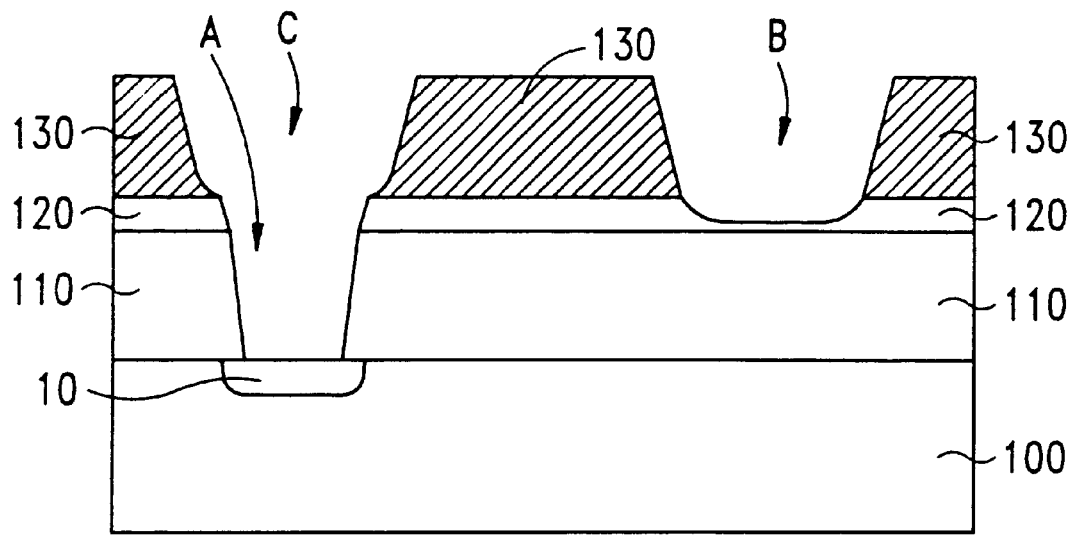
FIG. 4 shows the formation of a dual damascene structure on the substrate in accordance with prior art.
Figure 5:
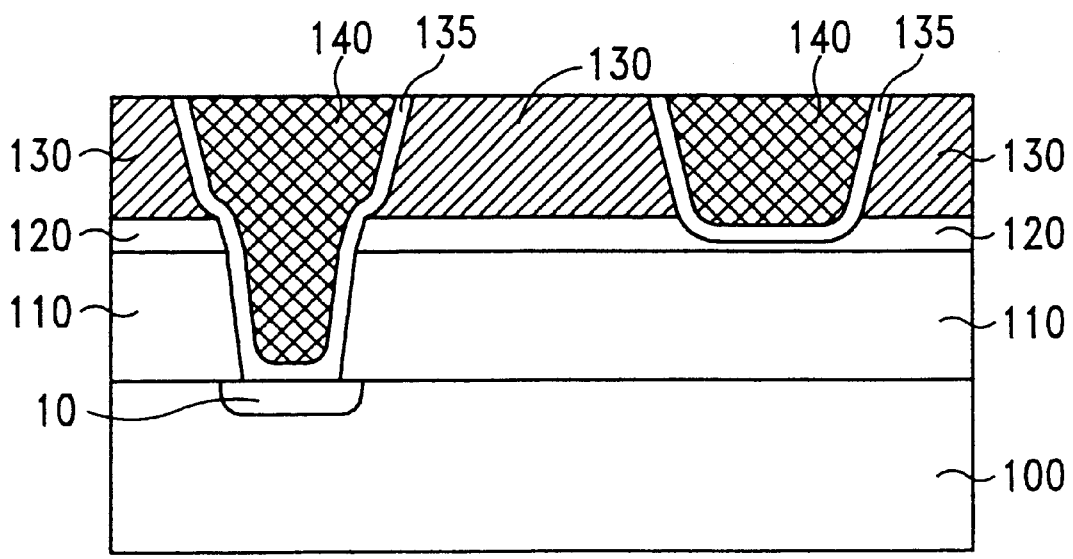
FIG. 5 shows that a metal layer is refilled into the dual damascene structure and the metal layer on the silicon nitride layer is removed by using a chemical mechanical polishing process in accordance with prior art.
Figure 6:
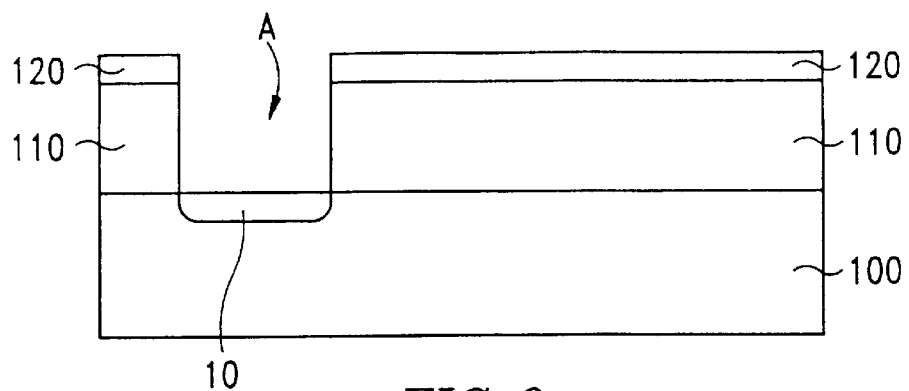
FIG. 6 is a cross sectional view of a substrate, wherein an oxide/nitride composing layer covers on the substrate and a via hole for an opening of a metal interconnect line is formed in the composing layer in accordance with the present invention.

Referring to FIG. 6, a single crystal substrate 100 is provided for the preferred embodiment. A metal interconnect line 10 is fabricated in the substrate 100. An intermetal dielectric (IMD) layer 110 is deposited over the substrate 100 and it is typically formed of silicon oxide material. Afterwards, a silicon nitride layer 120 is deposited over the IMD layer 110. In the present invention, the silicon nitride layer 120 serves as an etching stopper of metal trenches. In a case, the IMD layer 110 has a thickness between about 6000 to 10000 angstroms. In a preferred embodiment of the present invention, the thickness of the silicon nitride layer 120 is between about 1000 to 2000 angstroms.

Still referring to FIG. 6, the IMD layer 110 and the silicon nitride layer 120 on the metal interconnect line 10 are etched to form a via hole A. The etching process to form the via hole A is an anisotropical etching, such as a plasma etching process. Besides, a pattern of the via hole A is defined by using a conventional lithography technique. After the via hole A is defined, the metal interconnects line 10 exposes.

Figure 7:
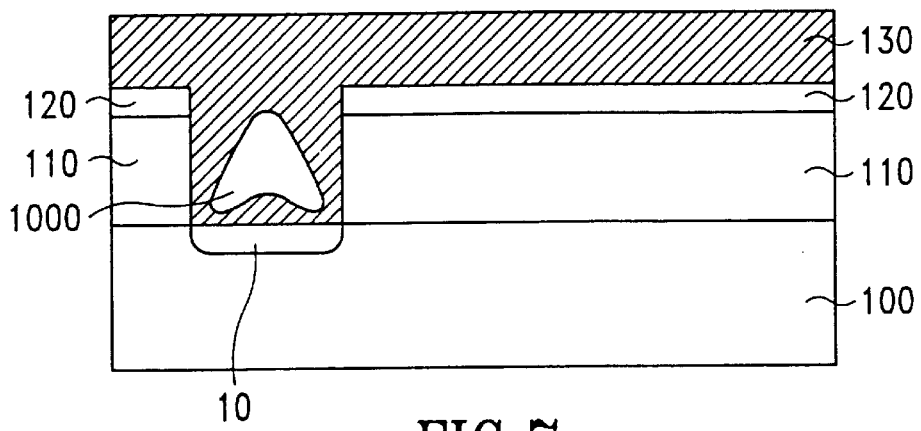
FIG. 7 shows the formation of an oxide layer, which is refilled into the via hole and covers a silicon nitride layer, and a void is formed in the via hole in accordance with the present invention.

Referring to FIG. 7, an IMD layer 130 is nonconformally deposited to refill into the via hole A and to cover the silicon nitride layer 120. It is noted that the deposition process to form the IMD layer 130 is not conformal. Besides, a void 1000 exists in the IMD layer 130 in the via hole A. As a thin film is nonformally deposited to refill into the via hole A; a void 1000 may form in the thin film in the via hole A. Thus, a close fillment is not formed in the via hole A. In a preferred embodiment, the thickness of the IMD layer 130 on the silicon nitride layer 120 is between about 5000 to 8000 angstroms. In a case, the IMD layer 130 is formed of silicon oxide material, which is deposited by using a plasma enhanced chemical vapor deposition (PECVD) process.

Figure 8:
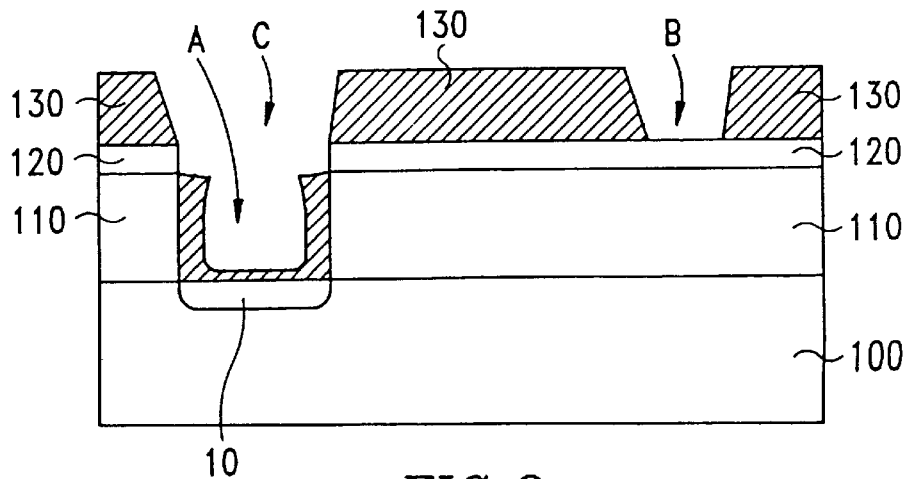
FIG. 8 is demonstrates the etching of a silicon oxide layer on the silicon nitride layer and in the via hole to form a dual damascene structure in the silicon oxide layer and in an oxide/nitride composing layer in accordance with the present invention.

Referring to FIG. 8, the IMD layer 130 is etched to define a trench B and a trench C in the IMD layer 130. A pattern of the metal trench B and the metal trench C is defined by using lithography technology. In a preferred embodiment, the etching process to form the trench B and the trench C is an anisotropically etching process for making sure that the critical dimension of the trench B and C is accurately controlled. Since the silicon nitride layer 120 is indicated as an etching stopper for the trench B and the trench C. As the trench B and the trench C are completely defined, the IMD layer 130 on the metal interconnect line 10 is not completely removed. Thus, after the definition of the trench B and C, a portion of the IMD layer 130 is remained on the sidewalls and the bottom of the via hole A.

Figure 9:
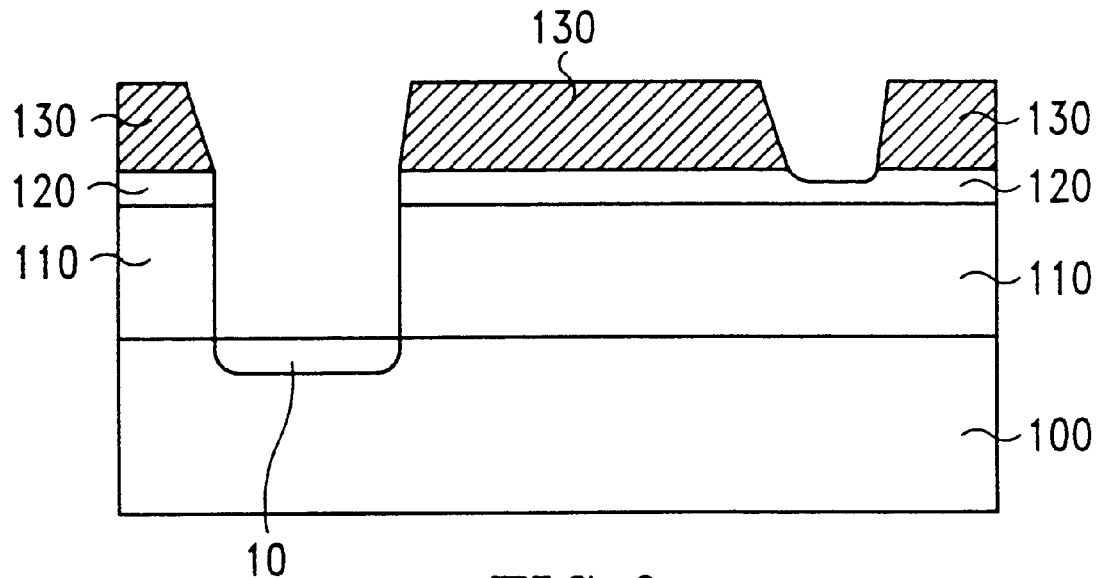
FIG. 9 shows the removing of a silicon oxide layer which is remained on sidewalls of the via hole in an oxide/nitride composing layer, to form a dual damascene structure in accordance with the present invention.

Referring to FIG. 9, an anisotropically etching process is used to remove the remaining portion of the IMD layer 110 in the via hole A. The etching process is performed by continuing the last etching process containing the same recipe as the last one.

Figure 10:
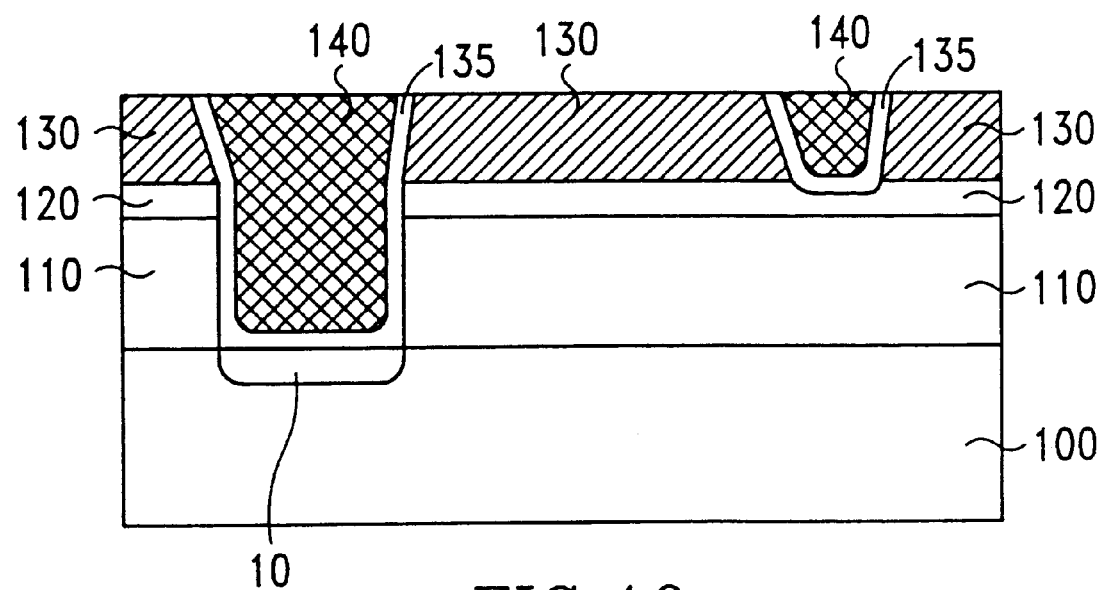
FIG. 10 shows the deposition of a metal layer that is refilled into the via hole on a substrate and another trench on a silicon nitride layer to form a dual damascene structure in accordance with the present invention.

Referring to FIG. 10, a metal layer 140 is deposited to refill into the via hole A, the trench B and the trench C, and to cover the IMD layer 130. In a case, the metal layer 140 is formed of metal aluminum. Before the deposition of the metal layer 140, a glue/barrier layer 135 is formed on the sidewalls and the bottom of the via hole A, the trench B and the trench C. The glue/barrier layer 135 is used to enhance the adhesion force between the metal layer 140 and the trenches. In a preferred embodiment, the formation of the glue/barrier layer 135 is to deposit a metal Ti layer over the sidewalls and the bottom of the trenches, and to then deposit a metal TiN layer over the metal Ti layer. Lastly, a chemical mechanical polishing (CMP) process is then performed to remove the metal layer 140 on the IMD layer 130. After that the via hole A, the trench B and the trench C is refilled by the metal layer 140, the dual damascene structure in the IMD layer 130 is complete.

In the dual damascene structure of the present invention, the via hole A is indicated as a contact hole of the metal interconnect line 10 and the metal layer 140 in the trench B and the trench C serves as a metal line of integrated circuits. In spite of the silicon nitride layer 120 serves as an etching stopper during the etching of the IMD layer 140, the loss of the silicon nitride layer 120 is effectively reduced. Since, a nonconfomal silicon oxide is refilled into the via hole A, a void 1000 is formed in the IMD layer 130 in the via hole A. Besides, the etching time for the IMD layer 130 can be decreased. Thus, the silicon nitride layer 120 that is used in the present invention could be thinner than that is used in prior art. The issue concerning that the induced stress of a thicker silicon nitride between IMD layers could be avoided in the present invention.

While the preferred embodiment of the invention has been illustrated and described, it will be appreciated that various changes can be made therein without departing from the spirit and scope of the invention.

What is claimed is:

1. A method to fabricate a dual damascene structure on a substrate, comprising steps of:

forming a first intermetal dielectric layer on said substrate;

forming a silicon nitride layer on said first intermetal dielectric layer;

etching said first intermetal dielectric layer and said silicon nitride layer to form a via hole on said substrate;

forming a second intermetal dielectric layer on said substrate and to refill into said via hole;

etching said second intermetal dielectric layer to form a first metal trench on said silicon nitride layer and a second metal trench in said second intermetal dielectric layer above said via hole, wherein said second intermetal dielectric layer in said via hole is etched and a portion of said second intermetal dielectric layer is remained on sidewalls and bottom of said via hole;

removing the remaining portion of said second intermetal dielectric layer in said via hole;

forming a glue/barrier layer on sidewalls and bottom of said via hole, said first metal trench and said second metal trench;

forming a metal layer on said glue/barrier layer to refill into said via hole, said first metal trench and said second metal trench, and to cover said second intermetal dielectric layer; and performing a chemical mechanical polishing (CMP) process to remove said metal layer on said second intermetal dielectric layer.

2. The method of claim 1, wherein said second intermetal dielectric layer and said silicon nitride layer are etched by using an anisotropically etching process.

3. The method of claim 1, wherein said first and second intermetal dielectric layers are formed of silicon oxide material.

4. The method of claim 1, wherein said second intermetal dielectric layer is formed by using a plasma enhanced chemical vapor deposition (PECVD) process.

5. The method of claim 1, wherein said second intermetal dielectric layer is formed by using a nonconformal deposition process.

6. The method of claim 1, wherein said second intermetal dielectric layer is etched by using an anisotropically etching process.

7. The method of claim 1, wherein said silicon nitride layer serves as an etching stop layer during the etching of said second intermetal dielectric layer.

8. The method of claim 1, wherein said metal layer is formed of metal aluminum.

9. The method of claim 1, wherein the formation of said glue/barrier layer is to deposit a metal Ti layer and then deposit a metal TiN layer.

10. The method of claim 1, wherein said first intermetal dielectric layer has a thickness between about 6000 to 10000 angstroms.

11. The method of claim 1, wherein said silicon nitride layer has a thickness between about 1000 to 2000 angstroms.

12. The method of claim 1, wherein said second intermetal dielectric layer has a thickness between about 5000 to 8000 angstroms.

13. A method to fabricate a dual damascene structure on a substrate, comprising steps of:

forming a first silicon oxide layer over said substrate;

forming a silicon nitride layer on said first silicon oxide layer;

etching said first silicon oxide layer and said silicon nitride layer to form a via hole on said substrate;

forming a second silicon oxide layer to cover on said substrate and to refill into said via hole by using plasma enhanced chemical vapor deposition (PECVD) process;

etching said second silicon oxide layer to form a first metal trench on said silicon nitride layer and a second metal trench in said second intermetal dielectric layer above said via hole, wherein said second silicon oxide layer in said via hole is etched and a portion of said second silicon oxide layer is remained on sidewalls and bottom of said via hole;

removing the remaining portion of said second silicon oxide layer in said via hole;

forming a glue/barrier layer on sidewalls and bottom of said via hole, said first metal trench and said second metal trench;

forming a metal layer on said barrier layer to refill into said via hole, said first metal trench and said second metal trench, and to cover said second silicon oxide layer; and performing a chemical mechanical polishing (CMP) process to remove said metal layer on said second silicon oxide layer.

14. The method of claim 13, wherein said second silicon oxide layer is etched by using an anisotropically etching process.

15. The method of claim 13, wherein said silicon nitride layer serves as an etching stop layer during the etching of said second silicon oxide layer.

16. The method of claim 13, wherein said metal layer is formed of metal aluminum.

17. The method of claim 13, wherein the formation of said glue/barrier layer is to deposit a metal Ti layer and then deposit a metal TiN layer.

18. The method of claim 13, wherein said first silicon oxide layer has a thickness between about 6000 to 10000 angstroms.

19. The method of claim 13, wherein said silicon nitride layer has a thickness between about 1000 to 2000 angstroms.

20. The method of claim 13, wherein said second silicon oxide layer has a thickness between about 5000 to 8000 angstroms.

* * * * *